United States Patent
Dupont et al.

(10) Patent No.: US 10,411,161 B2
(45) Date of Patent: Sep. 10, 2019

(54) LIGHT-EMITTING DEVICE HAVING A BUILT-IN LIGHT SENSOR

(71) Applicant: Aledia, Grenoble (FR)

(72) Inventors: Tiphaine Dupont, Grenoble (FR); Erwan Dornel, Fontaine (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/758,720

(22) PCT Filed: Sep. 9, 2016

(86) PCT No.: PCT/FR2016/052276
§ 371 (c)(1),
(2) Date: Mar. 8, 2018

(87) PCT Pub. No.: WO2017/042513
PCT Pub. Date: Mar. 16, 2017

(65) Prior Publication Data
US 2018/0254382 A1  Sep. 6, 2018

(30) Foreign Application Priority Data
Sep. 10, 2015 (FR) ..................................... 15 58407

(51) Int. Cl.
*H01L 31/173* (2006.01)
*H01L 33/26* (2010.01)
(Continued)

(52) U.S. Cl.
CPC ............ *H01L 33/26* (2013.01); *H01L 27/153* (2013.01); *H01L 31/103* (2013.01); *H01L 31/12* (2013.01);
(Continued)

(58) Field of Classification Search
CPC ...... H01L 31/125; H01L 31/173; H01L 31/12
See application file for complete search history.

(56) References Cited

U.S. PATENT DOCUMENTS

| 2003/0030808 A1 | 2/2003 | Marshall et al. | |
| 2009/0040755 A1* | 2/2009 | Kopp | H05B 33/0869 |
| | | | 362/231 |

(Continued)

FOREIGN PATENT DOCUMENTS

| FR | 2 896 944 A1 | 8/2007 |
| JP | 2 879971 B2 | 4/1999 |

(Continued)

OTHER PUBLICATIONS

English Translation of JP 2006/278368 to Sony Corp dated Oct. 12, 2016.*

(Continued)

*Primary Examiner* — Grant S Withers
(74) *Attorney, Agent, or Firm* — Wolf, Greenfield & Sacks, P.C.

(57) ABSTRACT

A light-emitting device including a substrate at least partially doped with a first conductivity type and including a first surface and light-emitting diodes, each diode including at least one three-dimensional semiconductor element, which is or is not doped with the first conductivity type. The semiconductor elements rest on a continuous first portion of the first surface and at least one semiconductor region that forms a photodiode that is at least partially doped with a second conductivity type which is opposite the first conductivity type, and extends into the substrate from a second portion of the first surface that is separate from the first portion.

12 Claims, 3 Drawing Sheets

(51) Int. Cl.
    *H01L 31/12*     (2006.01)
    *H01L 31/103*    (2006.01)
    *H01L 27/15*     (2006.01)
    *H01L 33/00*     (2010.01)
    *H01L 33/40*     (2010.01)
    *H01L 33/56*     (2010.01)
    *H01L 33/08*     (2010.01)
    *H01L 33/18*     (2010.01)
    *H01L 33/24*     (2010.01)
    *H01L 33/38*     (2010.01)

(52) U.S. Cl.
    CPC .......... *H01L 31/125* (2013.01); *H01L 31/173* (2013.01); *H01L 33/005* (2013.01); *H01L 33/40* (2013.01); *H01L 33/56* (2013.01); *H01L 33/08* (2013.01); *H01L 33/18* (2013.01); *H01L 33/24* (2013.01); *H01L 33/38* (2013.01); *H01L 2933/0016* (2013.01)

(56) References Cited

U.S. PATENT DOCUMENTS

2011/0079796 A1  4/2011  Wober
2014/0197436 A1*  7/2014  Kim .................. H01L 24/17
                                                257/98
2015/0108508 A1  4/2015  Wu et al.
2015/0243802 A1*  8/2015  Fujimoto .......... H01L 31/02327
                                                257/82
2016/0011111 A1*  1/2016  Stoll ................. G01N 21/645
                                                250/459.1
2016/0172528 A1*  6/2016  Okushiba ............ H01L 31/173
                                                257/81

FOREIGN PATENT DOCUMENTS

JP     2006 278368 A      10/2006
WO     WO 2015/016216 A1   2/2015

OTHER PUBLICATIONS

Dandin, M. "Optical filtering technologies for integrated fluorescence sensors" Lab Chip iss. 7, Jul. 10, 2007 pp. 955-977.*

Written Opinion for Application No. PCT/FR2016/052276 dated Nov. 29, 2016.

International Search Report for Application No. PCT/FR2016/052276 dated Nov. 29, 2016.

* cited by examiner

LIGHT-EMITTING DEVICE HAVING A BUILT-IN LIGHT SENSOR

CROSS-REFERENCE TO RELATED APPLICATIONS

This application is the national phase of International Application No. PCT/FR2016/052276, filed on Sep. 9, 2016, which claims priority to French Patent Application No. 15/58407, filed on Sep. 10, 2015, both of which applications are incorporated herein by reference to the maximum extent allowable.

BACKGROUND

The present invention generally relates to light-emitting devices based on semiconductor materials and to methods of manufacturing the same. Light-emitting devices means devices capable of converting an electric signal into an electromagnetic radiation.

DISCUSSION OF THE RELATED ART

For certain applications, it is desirable to measure the radiation emitted by a light-emitting device. This is particularly true to perform tests during the manufacturing of the light-emitting device or when the light-emitting device is operating. The measurement of the radiation emitted by a light-emitting device may be performed by means of a light sensor, comprising at least one photodiode different from the light-emitting device, which causes an additional cost. Further, to perform a continuous measurement of light, the light sensor should generally be placed in the emission field of the light-emitting device and, thereby, block a portion of the light flow which would be perceived by an observer, which is not desirable.

It would be desirable to be able to form the light sensor so that it is integrated to the light-emitting device. This would enable to easily measure the radiation emitted by the light-emitting device at given times, and particularly continuously.

Patent application WO2014/154657 describes an optoelectronic device comprising an integrated light sensor. The optoelectronic device comprises light-emitting diodes having the shape of semiconductor nanowires. Some of the wires, normally used to form light-emitting diodes, are modified to form the light sensor.

A disadvantage of the optoelectronic device described in patent application WO2014/154657 is that it uses the same quantum well layers for the emission and the detection. The layers are transparent to wavelengths greater than the emission wavelength and are thus not adapted to the detection of such wavelengths. Another disadvantage is that the light sensor does not enable to dissociate different wavelengths, and thus does not enable, for example, to determine the color of the radiation emitted by the optoelectronic device.

SUMMARY

Thus, an object of an embodiment is to overcome at least part of the disadvantages of the previously-described light-emitting devices comprising an integrated light sensor and of their manufacturing methods.

Another object of an embodiment is for the light sensor to be capable of detecting the color of the radiation supplied by the optoelectronic device.

Another object of an embodiment is for the optoelectronic device to be capable of modifying and/or of regulating the color of the radiation supplied by the light-emitting diodes based on the signals supplied by the light sensor.

Thus, an embodiment provides a light-emitting device comprising:

an at least partially doped substrate of a first conductivity type, comprising a first surface;

light-emitting diodes, each comprising at least one non-doped or doped three-dimensional semiconductor element of the first conductivity type, the semiconductor elements resting on a first continuous portion of the first surface; and at least one semiconductor region forming an at least partially doped photodiode, of a second conductivity type opposite to the first conductivity type and extending in the substrate from a second portion of the first surface different from the first portion.

According to an embodiment, each three-dimensional semiconductor element is mainly made of a compound selected from the group comprising III-V compounds and II-VI compounds.

According to an embodiment, the substrate is at least partly made of a semiconductor material selected form the group comprising silicon, germanium, silicon carbide, III-V compounds, or ZnO.

According to an embodiment, the substrate comprises a second surface opposite to the first surface, the light-emitting device comprising a first electrode in contact with the second surface or with the first surface.

According to an embodiment, the device comprises a second electrode in contact with at least some of the light-emitting diodes and a third electrode in contact with the semiconductor region on the side of the first surface.

According to an embodiment, the semiconductor region is covered with a colored filter.

According to an embodiment, the light-emitting diodes are covered with a layer comprising phosphors and the semiconductor region is not covered with said layer comprising the phosphors.

According to an embodiment, the semiconductor elements are nanowires, microwires, and/or nanometer- or micrometer-range pyramidal structures.

According to an embodiment, the semiconductor region is formed by ion implantation of dopants.

According to an embodiment, the semiconductor region is formed by epitaxy.

According to an embodiment, the light-emitting diodes are distributed in assemblies of light-emitting diodes, the light-emitting device comprising, for at least some of the assemblies, at least two semiconductor regions forming first and second photodiodes, each of the two semiconductor regions being at least partially doped with a second conductivity type opposite to the first conductivity type and extending in the substrate from a second portion of the first surface different from the first portion.

According to an embodiment, the first and second photodiodes have different junction depths and/or are covered with different color filters.

According to an embodiment, the light-emitting diodes are distributed in assemblies of light-emitting diodes, said semiconductor region being located between the two assemblies.

According to an embodiment, the device comprises a circuit for processing first signals supplied by the photodiode and a circuit for controlling the light-emitting diodes from second signals supplied by the processing circuit.

According to an embodiment, the control circuit is capable, in a calibration phase, of successively turning on each assembly of light-emitting diodes, the processing circuit being capable of measuring the radiation captured by the photodiode when each assembly of light-emitting diodes is on.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
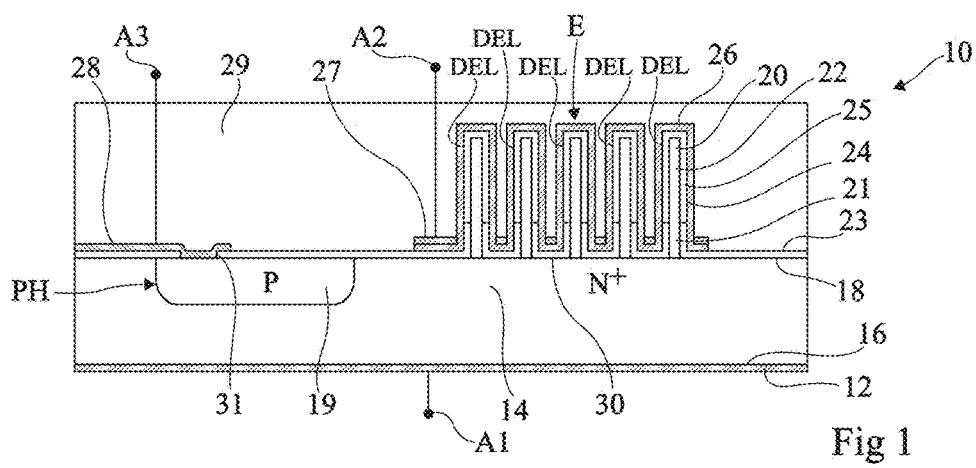
FIG. 1 is a partial simplified cross-section view of an embodiment of a light-emitting device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the light-emitting devices described hereafter are within the abilities of those skilled in the art and are not described. In the following description, unless otherwise indicated, terms "substantially", "approximately", and "in the order of" mean "to within 10%". Further, in the present description, term "connected" is used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

The present description relates to light-emitting devices comprising semiconductor elements having the shape of microwires, of nanowires, or of pyramids.

Term "microwire" or "nanowire" designates a three-dimensional structure having an elongated shape, for example, cylindrical, conical, or tapered, along a preferred direction, having at least two dimensions, called minor dimensions, in the range from 50 nm to 2.5 µm, preferably from 300 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 300 nm to 800 nm. In certain embodiments, the height of each microwire or nanowire may be greater than or equal to 500 nm, preferably in the range from 1 µm to 50 µm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter. The base of the wire for example has an oval, circular, or polygonal shape, particularly triangular, rectangular, square, or hexagonal.

In the following description, term pyramid or truncated pyramid designates a three-dimensional structure having a pyramidal shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm.

In the following description, embodiments will be described in the case of a light-emitting device with light-emitting diodes comprising semiconductor elements having the shape of microwires or of nanowires.

FIG. 1 is a partial simplified cross-section view of a light-emitting device 10 formed from wires such as previously described and capable of emitting an electromagnetic radiation.

Device 10 comprises, from bottom to top in FIG. 1:

a first biasing electrode 12;

a doped substrate 14, for example, semiconductor, of a first conductivity type, for example, N-type doped, and comprising parallel surfaces 16 and 18, surface 16 being in contact with electrode 12;

at least one doped or partially doped semiconductor region 19 formed in substrate 14, of a second conductivity type opposite to the first conductivity type, for example, P-type doped, and extending in substrate 14 from surface 18 over a portion of the thickness of substrate 14;

semiconductor elements 20, which, in the present embodiment, correspond to wires, five wires 20 of parallel axes being shown, each wire 20 comprising a lower portion 21 of the first conductivity type extending in an upper portion 22 of the first conductivity type, lower portion 21 resting on substrate 14 and being possibly in contact with substrate 14 or separated from substrate 14 by a seed portion, not shown in FIG. 1;

an electrically-insulating layer 23 covering the periphery of the lower portion 21 of each wire 20 and covering surface 18 between wires 20;

a shell 25 covering the outer wall 24 of the upper portion 22 of each wire 20, shell 25 comprising at least one stack of an active layer covering upper portion 22 and of a semiconductor layer of the second conductivity type covering the active layer;

a second electrode layer 26 covering each shell 25;

a conductive reflective layer 27 extending over second electrode layer 26 between wires 20 without extending on wires 20;

a third electrode 28 in contact with semiconductor region 19 through an opening 31 provided in insulating layer 23; and possibly, an encapsulation layer 29 covering the entire structure.

According to another embodiment, shell 25 may at least partly cover lower portion 21 as well as upper portion 22 of each wire 20. In this case, electrically-insulating layer 23 covers the lower portion of shell 25.

Optoelectronic device 10 may further comprise a phosphor layer, not shown, provided on encapsulation layer 29 or confounded therewith. The phosphors are capable, when they are excited by the light emitted by the light-emitting diodes, of emitting light at a wavelength different from the wavelength of the light emitted by the light-emitting diodes. As an example, the light-emitting diodes are capable of emitting blue light and the phosphors are capable of emitting yellow light when they are excited by blue light. Thereby, an observer perceives light corresponding to a composition of the blue and yellow lights which, according to the proportion of each light, may be substantially white. The final color perceived by the observer is characterized by its chromatic coordinates such as defined by the standards of the International Commission on Illumination.

Optoelectronic device 10 may further comprise a transparent layer arranged on the phosphor layer. Optoelectronic device 10 may further comprise a diffusing element on the phosphor layer or on the transparent layer enabling to reflect part of the light towards the photodiode.

The assembly formed by a wire 20 and shell 25 forms a light-emitting diode DEL. When a plurality of light-emitting diodes DEL are formed on substrate 14, they may be connected in series and/or in parallel and form an assembly of light-emitting diodes. The assembly may comprise from a few light-emitting diodes DEL to a few thousands of light-emitting diodes DEL. As an example, in FIG. 1, light-emitting diodes DEL form a group E of five light-emitting diodes DEL assembled in parallel.

The junction between P-type doped semiconductor region 19 and the N-type doped portion of substrate 14, extending around region 19, forms a photodiode PH. Encapsulation layer 29 preferably covers light-emitting diodes DEL and photodiode PH.

First electrode 12 is coupled to a node A1, second electrode 26 is coupled to a node A2 and third electrode 28 is coupled to a node A3. In operation, the voltage applied between electrodes 12 and 26 is such that each light-emitting diode DEL is conductive so that the active layer of each light-emitting diode DEL emits light radiation. Part of the radiation emitted by the active layers of light-emitting diodes DEL may be captured by photodiode PH. Given that the ratio of the light power captured by each photodiode PH to the light power emitted by the neighboring light-emitting diodes DEL may be known, the signal supplied by each photodiode PH is thus representative of the light power emitted by light-emitting diodes DEL.

According to an embodiment, photodiodes PH are reverse-biased. The reverse current of each photodiode PH then depends on the light radiation captured by photodiode PH. In the embodiment shown in FIG. 1, this means that the potential at node A3 is smaller than the potential at node A1. According to another embodiment, photodiodes PH are forward biased. Photodiodes PH can then be used as a temperature sensor.

Photodiode PH is formed by a junction between regions of a semiconductor material having different dopings.

Wires 20 are formed on an area 30 of surface 18 of substrate 14 and semiconductor region 19 is formed outside of area 30. In particular, semiconductor region 19 does not extend between wires 20. Preferably, the minimum distance between the edge of semiconductor region 19 and the base of the closest wire 20 is greater than 1 µm.

FIGS. 2 to 5 show simplified top views of optoelectronic device 10, where the contour of region 30 having assembly E of light-emitting diodes formed thereon has been shown with a short-dash line and where the contour of semiconductor region 19 has been shown with a continuous line.

Figure 2:
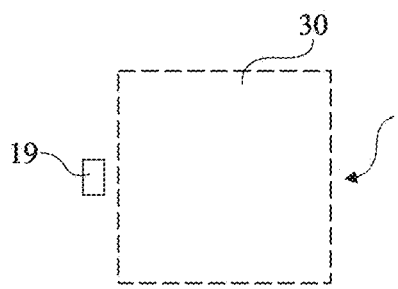
FIGS. 2 to 5 are partial simplified top views of optoelectronic devices showing layouts of light-emitting diodes and of a photodiode.
Figure 3:
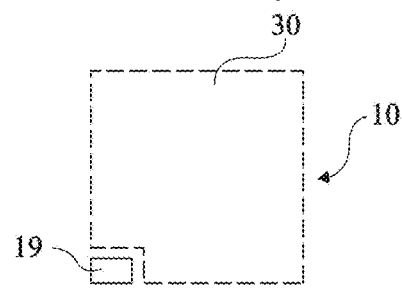
Figure 4:
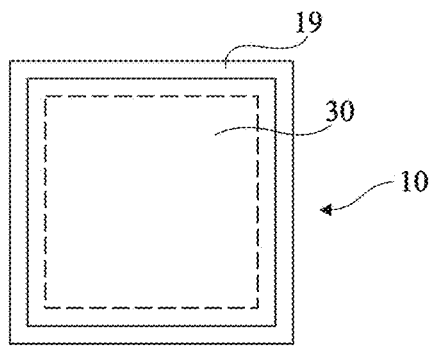
Figure 5:
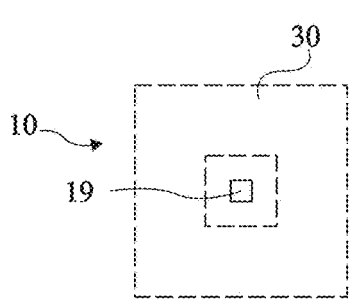

In FIG. 2, photodiode PH is arranged along an edge of assembly E of light-emitting diodes. Photodiode PH may be arranged along all or part of an edge of assembly E of light-emitting diodes. In FIG. 3, assembly E of light-emitting diodes may be formed on a surface comprising a recess on an edge having photodiode PH formed therein. This advantageously enables to decrease the surface area of the dead spaces on the integrated circuit wafer having optoelectronic device 10 formed thereon. In FIG. 4, photodiode PH is arranged all around assembly E of light-emitting diodes. The signal measured by photodiode PH then advantageously enables to determine the radiation emitted over the entire periphery of assembly E of light-emitting diodes. In FIG. 5, assembly E of light-emitting diodes is arranged around photodiode PH. The signal measured by photodiode PH is then advantageously little disturbed by outer electromagnetic radiations.

Substrate 14 may correspond to a monoblock structure or correspond to a layer covering a support made of another material. Substrate 14 is preferably a semiconductor substrate, for example, a silicon, germanium, silicon carbide substrate, of a III-V compound which is not transparent to the emission wavelength of light-emitting diodes, such as InGaN or GaAs. Preferably, substrate 14 is a single-crystal silicon substrate. Preferably, it is a semiconductor substrate compatible with manufacturing methods implemented in microelectronics. Substrate 14 may correspond to a multi-layer structure of silicon-on-insulator type, also called SOI. The thickness of substrate 14 is for example in the range from 10 µm to 1.5 mm.

Substrate 14 is doped with the first conductivity type at least across part of its thickness from surface 18. When substrate 14 is monoblock, it may be uniformly doped. As a variation, substrate 14 may comprise a doped region of the first conductivity type extending from surface 18 into the thickness of substrate 14, only across part of the thickness of substrate 14, and resting on a less heavily-doped or non-doped region. Substrate 14 is for example a doped substrate of the first conductivity type with a dopant concentration in the range from $1*10^{15}$ atoms/cm$^3$ to $2*10^{20}$ atoms/cm$^3$, preferably in the range from $5*10^{17}$ atoms/cm$^3$ to $5*10^{19}$ atoms/cm$^3$, for example, approximately $3*10^{18}$ atoms/cm$^3$. In the case of a silicon substrate 14, examples of P-type dopants are boron (B) or indium (In) and examples of N-type dopants are phosphorus (P), arsenic (As), or antimony (Sb). Surface 18 of silicon substrate 10 may be a (100) surface or a (111) surface.

Semiconductor region 19 may have a depth, measured from surface 18, in the range from 200 nm to 4 µm, preferably in the range from 400 nm to 800 nm. Region 19 is for example doped with the second conductivity type with a dopant concentration in the range from $5*10^{16}$ atoms/cm$^3$ to $1*10^{22}$ atoms/cm$^3$, preferably in the range from $5*10^{17}$ atoms/cm$^3$ to $5*10^{19}$ atoms/cm$^3$, for example, approximately $6*10^{18}$ atoms/cm$^3$.

According to an embodiment, semiconductor region 19 and semiconductor region 44, described hereafter, may be formed by ion implantation of dopants. The implantation depth may be selected according to the wavelength to be detected, which enables to have a color-selective sensor.

According to another embodiment, semiconductor region 19 and semiconductor region 44 may be formed by epitaxy. According to an embodiment, semiconductor region 19 and semiconductor region 44 are formed by at least one implantation step, which may be implemented before the forming of wires 20 and of shells 25 or after the forming of wires 20 and of shells 25. Preferably, semiconductor region 19 is formed by at least one implantation step implemented after the forming of wires 20 and of shells 25. This enables to avoid a diffusion of the dopants from semiconductor region 19 during the steps of forming light-emitting diodes DEL. When semiconductor region 19 is formed by at least one implantation step implemented after the forming of wires 20 and of shells 25, wires 20 and shells 25 may be covered with a dielectric protection layer.

According to another embodiment, semiconductor region 19 may be divided into a plurality of non-doped or doped semiconductor sub-regions of the second conductivity type, with a dopant concentration which decreases as the distance from surface 18 increases, to improve the electric contact between semiconductor region 19 and third electrode 28 through opening 31 and to improve the photodiode efficiency. In this case, semiconductor region 19 may be formed by a plurality of implantation steps.

First electrode 12 may correspond to a conductive layer which extends on surface 16 of substrate 14. The material forming electrode 12 is, for example, nickel silicide (NiSi), aluminum (Al), aluminum silicide (AlSi), titanium (Ti), copper (Cu), tungsten silicide ($WSi_2$), or titanium silicide (TiSi). Third electrode 28 may have the same composition as first electrode 12.

Insulating layer 23 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond. As an example, the thickness of insulating layer 23 is in the range from 5 nm to 300 nm, for example, equal to approximately 100 nm. Insulating layer 23 may have a monolayer structure or may correspond to a stack of two layers or of more than two layers.

Semiconductor elements 20 are at least partly made of at least one semiconductor material. The semiconductor material is selected from the group comprising III-V compounds, II-VI compounds, or group-IV semiconductors or compounds.

Semiconductor elements 20 may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Semiconductor elements 20 may be at least partly made from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Semiconductor elements 20 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

When the three-dimensional semiconductor elements 20 of the optoelectronic device correspond to wires, the total height of each wire may be in the range from 250 nm to 50 µm. Each wire 20 may have a semiconductor structure elongated along an axis substantially perpendicular to surface 18. Each wire 20 may have a generally cylindrical shape with an oval, circular, or polygonal base, particularly triangular, rectangular, square, or hexagonal. The axes of two adjacent wires 20 may be distant by from 0.5 µm to 10 µm and preferably from 1.5 µm to 5 µm. As an example, wires 20 may be regularly distributed, particularly in a hexagonal network.

According to an embodiment, the lower portion 21 of each wire is predominantly made of a III-N compound, for example, gallium nitride, doped with a first conductivity type, for example, N-type doped. The N-type dopant may be silicon. The height of lower portion 21 may be in the range from 200 nm to 25 µm.

According to an embodiment, upper portion 22 of each wire is for example at least partly made of a III-N compound, for example, gallium nitride. Portion 22 may be doped with the first conductivity type, for example, type N, or not be intentionally doped. The height of portion 22 may be in the range from 500 nm to 25 µm.

As a variation, for each wire 20, insulating layer 23 may extend over part of upper portion 22, not extend over the entire portion 21, or extend over a portion of shell 25. As a variation, shell 25 may extend over all or part of lower portion 21.

When the three-dimensional semiconductor elements 20 of optoelectronic device 10 correspond to pyramids, the height of each pyramid may be in the range from 100 nm to 25 µm. Each pyramid may have a semiconductor structure elongated along an axis substantially perpendicular to surface 18. The base of each pyramid may have a general shape of oval, circular, or polygonal type, particularly triangular, rectangular, square, or hexagonal. The centers of two adjacent pyramids may be distant by from 0.25 µm to 10 µm and preferably from 1.5 µm to 5 µm. As an example, the pyramids may be regularly distributed, particularly in a hexagonal network.

In the case of a wire 20 predominantly made of GaN, the crystal structure of the wire may be of wurtzite type, the wire extending along crystallographic direction C.

The active layer of shell 25 is the layer from which most of the radiation provided by device 10 is emitted. The active layer may comprise confinement means. As an example, the layer may comprise a single quantum well or multiple quantum wells.

Second electrode 26 is capable of biasing the active layer covering each wire 20 and of giving way to the electromagnetic radiation emitted by light-emitting diodes DEL. The material forming second electrode 26 may be a transparent and conductive material such as indium tin oxide (ITO), zinc oxide, doped or not with aluminum or gallium, or graphene. As an example, electrode layer 26 has a thickness in the range from 5 nm to 200 nm, preferably from 20 nm to 50 nm.

Encapsulation layer 29 may be made of an at least partially transparent inorganic material.

As an example, the inorganic material is selected from the group comprising silicon oxides, of type $SiO_x$ where x is a real number between 1 and 2, or $SiO_yN_z$ where y is a real number between 0 and 2 and where z is a real number between 0 and 1, and aluminum oxides, for example, $Al_2O_3$. The inorganic material may then be deposited by low-temperature CVD, particularly at a temperature lower than 300° C.-400° C., for example by PECVD (plasma enhanced chemical vapor deposition).

Encapsulation layer 29 may be made of an at least partially transparent organic material. As an example, encapsulation layer 29 is a silicone polymer, an epoxide polymer, an acrylic polymer, or a polycarbonate. Encapsulation layer 29 may then be deposited by a spin coating method, by an inkjet printing method, or by a silk-screening method. A method of dispensing by time/pressure feeder or by volumetric feeder is also possible in automated mode on programmable equipment.

An example of a method of manufacturing light-emitting diodes DEL is described in patent application US2014/0077151.

According to an embodiment, each semiconductor element 20 is not in direct contact with substrate 14 but directly rests on a portion of a material favoring the growth of semiconductor elements 20, called seed pads. As an example, the material forming the seed pads may be a nitride, a carbide, or a boride of a transition metal from column IV, V, or VI of the periodic table of elements or a combination of these compounds. As an example, the seed pads may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbonitride (TaCN), of magnesium nitride in $Mg_xN_y$ form, where x is approximately equal to 3 and y is approximately equal to 2, for example, magnesium nitride in form $Mg_3N_2$. The seed pads may be doped with the same conductivity type as substrate 14. The seed pads for example have a thickness in the range from 1 nm to 100 nm, preferably in the range from 10 nm to 30 nm. As a variation, the seed pads may be replaced with seed layers covering substrate 14 and interposed between substrate 14 and semiconductor elements 20.

When the seed pads are made of aluminum nitride, they may be substantially textured and have a preferred biasing. The texturing of the seed pads may be obtained by an additional treatment performed after the deposition of the seed pads. It for example is an anneal under an ammonia flow ($NH_3$). In the case of a wire 20 predominantly made of GaN, each seed pad may favor the growth of GaN with the N polarity.

Figure 6:
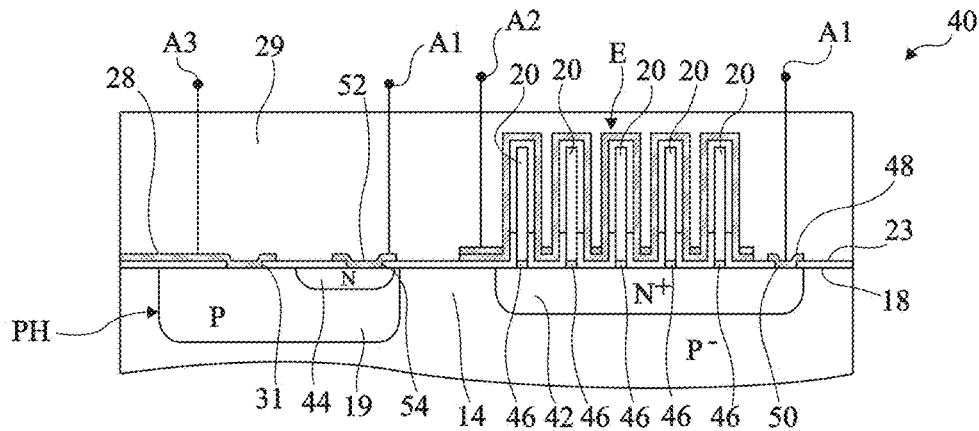
FIGS. 6 and 8 are partial simplified cross-section views of other embodiments of a light-emitting device comprising microwires or nanowires.

FIG. 6 shows another embodiment of a light-emitting device 40. Light-emitting device 40 comprises all the elements of light-emitting device 10 shown in FIG. 1, with the following differences:

substrate 14 is a non-doped or lightly-doped substrate of the second conductivity type, for example, of type P;

a doped semiconductor region 42 of the first conductivity type, for example, of type N, more heavily doped than the substrate, extending in substrate 14 from the entire area 30 of surface 18 supporting wires 20;

a doped semiconductor region 44 of the first conductivity type, for example, N-type doped, more heavily-doped than the substrate, is formed in semiconductor region 19 from surface 18;

first electrode 12 is replaced with a conductive pad 48, coupled to node A1, in contact with semiconductor region 42 through an opening 50 provided in insulating layer 23 and with a conductive pad 52, coupled to node A1, in contact with semiconductor region 44 through an opening 54 provided in insulating layer 23.

Region 42 is a heavily-doped region. Preferably, the conductivity type of region 42 is opposite to the conductivity type of substrate 14. As an example, FIG. 5 shows a lightly-doped P-type substrate 14 and a heavily-doped N-type region 42. The dopant concentration of region 42 is in the range from $5*10^{16}$ atoms/$cm^3$ to $2*10^{20}$ atoms/$cm^3$, preferably from $3*10^{17}$ atoms/$cm^3$ to $5*10^{18}$ atoms/$cm^3$. The thickness of region 42 is in the range from 150 nm to several micrometers, preferably from 150 nm to 1 µm, more preferably from 250 nm to 400 nm.

Region 44 is a heavily-doped region. Preferably, the conductivity type of region 44 is opposite to the conductivity type of substrate 14. As an example, FIG. 6 shows a lightly-doped P-type substrate 14 and a heavily-doped N-type region 44. The dopant concentration of region 44 is in the range from $5*10^{16}$ atoms/$cm^3$ to $2*10^{20}$ atoms/$cm^3$, preferably from $3*10^{17}$ atoms/$cm^3$ to $5*10^{18}$ atoms/$cm^3$. The thickness of region 44 is in the range from 150 nm to several micrometers, preferably from 150 nm to 1 µm, more preferably from 150 nm to 400 nm.

In FIG. 6, seed pads 46 have further been shown under each wire 20.

Figure 7:
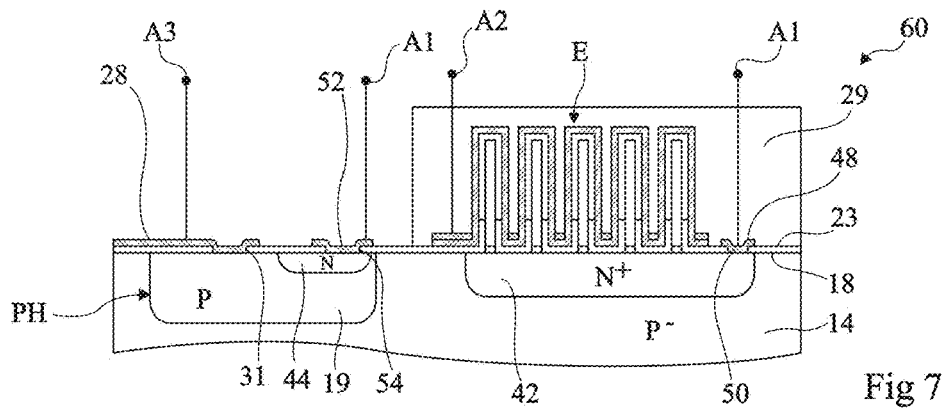

FIG. 7 shows another embodiment of a light-emitting device 60. Light-emitting device 60 comprises all the elements of light-emitting device 40 shown in FIG. 6, with the difference that encapsulation layer 29 does not cover photodiode PH. Such an embodiment advantageously enables to capture, in addition to the radiation supplied by light-emitting diode assembly E, a radiation emitted by another light source.

Figure 8:
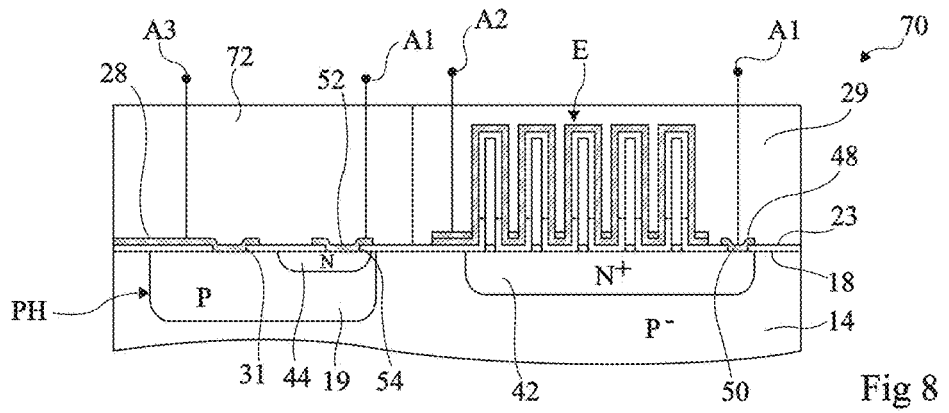

FIG. 8 shows another embodiment of a light-emitting device 70. Light-emitting device 70 comprises all the elements of light-emitting device 60 shown in FIG. 7 and further comprises a colored filter 72 covering photodiode PH. Colored filter 72 may be formed by a colored resin layer. Colored filter 72 advantageously enables photodiode PH to only detect the intensity of a portion of the emission spectrum. For this purpose, the absorption spectrum of the filter should be selected to only transmit the wavelength range which is desired to be detected.

Figure 9:
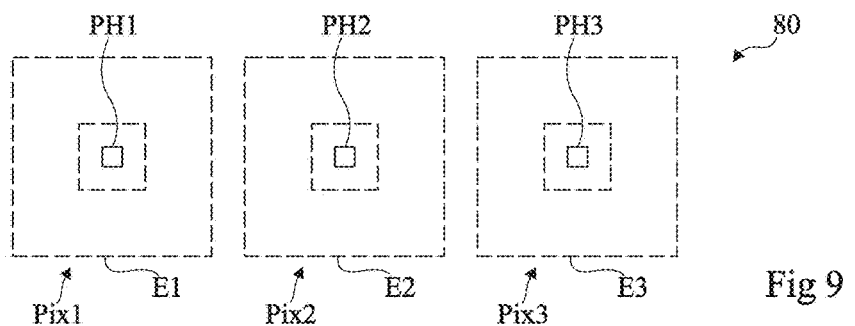
FIGS. 9 and 10 are partial simplified top views of optoelectronic devices showing layouts of light-emitting diodes and of photodiodes.

FIG. 9 is a partial simplified top view of another embodiment of an optoelectronic circuit 80 comprising three assemblies E1, E2, and E3 of light-emitting diodes and three photodiodes PH1, PH2, and PH3. In FIG. 9, the contour of region 30 having each assembly E1, E2, and E3 of light-emitting diodes formed thereon has been shown by a short dashed line and the contour of semiconductor region 19 associated with each photodiode PH1, PH2, and PH3 has been shown by a full line. According to an embodiment, each light-emitting diode assembly E1, E2, and E3 belongs to a display pixel Pix1, Pix2, and Pix3. An opaque element, not shown, for example, a reflective element, may be arranged between each pair of adjacent pixels. Display pixels Pix1, Pix2, and Pix3 are capable of emitting a radiation at different wavelengths. For this purpose, according to an embodiment, the composition of the active layers of light-emitting diode assemblies E1, E2, and E3 are different and adapted to emit radiations at different wavelengths. According to another embodiment, each light-emitting diode assembly E1, E2, and E3 is covered with a block of phosphors having different compositions, adapted so that pixels Pix1, Pix2 and Pix3 emit radiations at different wavelengths. The information relative to the intensities of the lights emitted by light-emitting diodes E1, E2, and E3 and respectively measured by photodiode PH1, PH2, and PH3 may be advantageously used to adjust the power supply currents of light-emitting diodes E1, E2, and E3 and thus vary the color perceived by an observer of light-emitting diode assembly E1, E2 and E3. Advantageously, the color perceived by an observer may be white.

Figure 10:
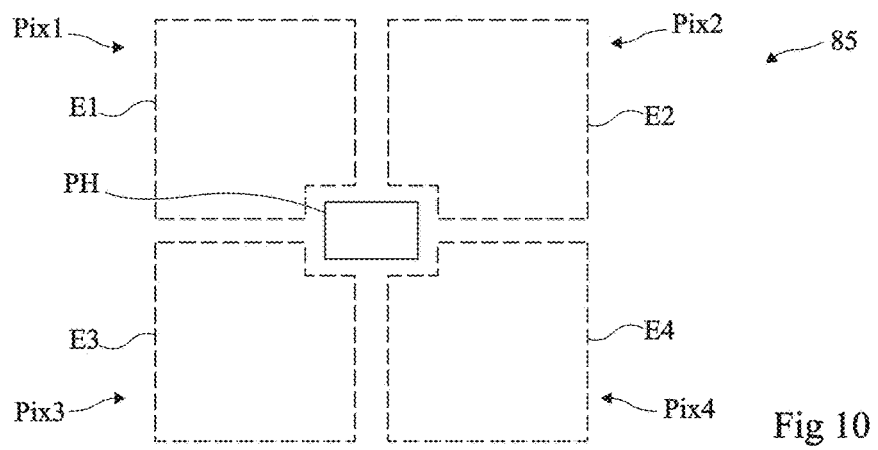

FIG. 10 is a partial simplified top view of another embodiment of an optoelectronic circuit 85 comprising four assemblies E1, E2, E3, and E4 of light-emitting diodes arranged in two rows and two columns and a photodiode PH located at the center of the arrangement of light-emitting diode assemblies E1, E2, E3, and E4. According to an embodiment, each light-emitting diode assembly E1, E2, E3, and E4 belongs to a display pixel Pix1, Pix2, Pix3, and Pix4. As an example, a display screen may be obtained by the repeating of the layout shown in FIG. 9 or 10. According to an embodiment of a color measurement or calibration method, each pixel Pix1, Pix2, Pix3, and Pix4 may be successively turned on and the emitted intensity may be detected by the single photodiode PH, to form the general spectral spectrum and calculate the color point.

Figure 11:
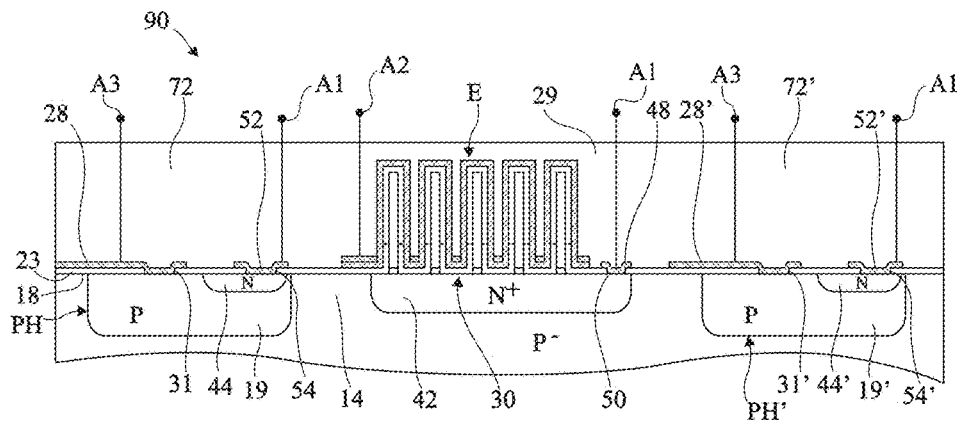
FIG. 11 is a partial simplified cross-section view of another embodiment of a light-emitting device comprising microwires or nanowires.

FIG. 11 shows another embodiment of a light-emitting device 90. Light-emitting device 90 comprises all the elements of light-emitting device 70 shown in FIG. 8 and further comprises an additional photodiode PH' capable of having a structure similar to that of photodiode PH, the elements of photodiode PH' being designated with the same reference numerals as for photodiode PH to which an apostrophe is added. According to an embodiment, the junction of photodiode PH' is formed at a different depth from that of photodiode PH. Photodiode PH' advantageously enables to capture a radiation at a wavelength different from that of the radiation captured by photodiode PH. This may be obtained, for example, by a region 44' having a deeper extension than region 44. As an example, photodiode PH may be adapted to mainly capture the light directly emitted by light-emitting diode assembly E and photodiode PH' may be adapted to mainly capture the radiation reemitted by the phosphor layer covering light-emitting diode assembly E. According to an embodiment, photodiodes PH and PH' are topped with different color filters 72 and 72'. Photodiodes PH and PH' can thus be used to obtain a estimate of the emission spectrum of light-emitting diode assembly E to determine a color point of light-emitting device 90. The method of calibrating light-emitting device 90 and the method of calculating the color point may be methods known by those skilled in the art, for example, the methods described in G. Eppeldauer's publication, "Spectral Response Based Calibration Method of Tristimulus Colorimeters" J. Res. Natl. Inst. Stand. Technol. 103, 615 (1998).

Figure 12:
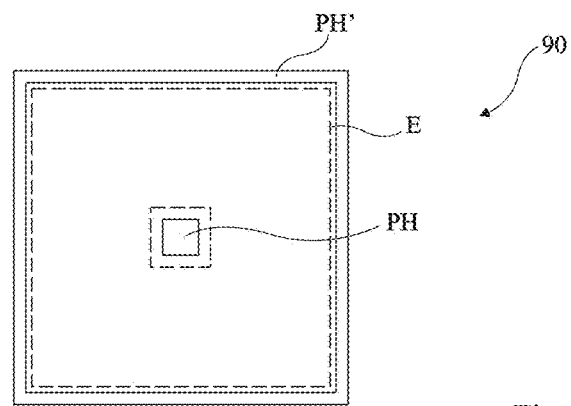
FIG. 12 is a partial simplified top view of the optoelectronic device of FIG. 11.

FIG. 12 is a simplified top view of an embodiment of light-emitting device 90 where light-emitting diode assembly E may be arranged around first photodiode PH and photodiode PH' is arranged around light-emitting diode assembly E.

Figure 13:
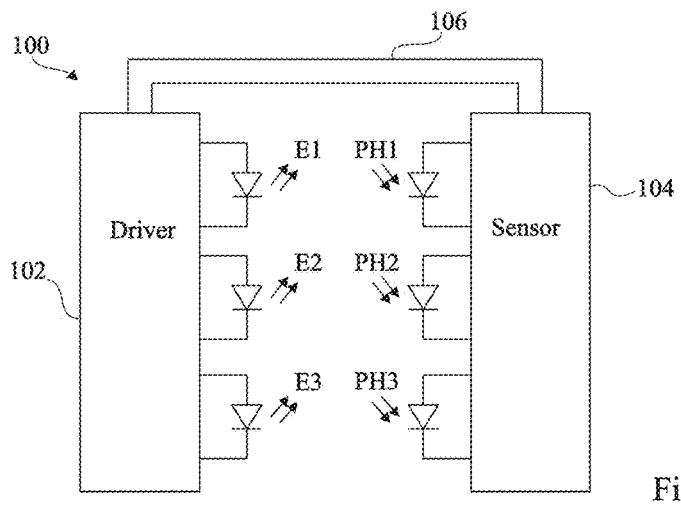
FIG. 13 is an electric diagram of an embodiment of a light-emitting device.

FIG. 13 shows an equivalent electric diagram of an embodiment of a light-emitting device 100 comprising three assemblies E1, E2, E3 of light-emitting diodes, three photodiodes PH1, PH2, PH3, a circuit 102 (Driver) for controlling light-emitting diode assemblies E1, E2, E3 and a circuit 104 (Sensor) for processing the signals supplied by photodiodes PH1, PH2, PH3. Processing circuit 104 is capable of exchanging data with control circuit 102 over a data exchange bus 106. The signals supplied by processing circuit 104 may for example be used to regulate the intensity and/or the color of the light emitted by light-emitting diode assemblies E1, E2, E3 via a control of the currents powering the light-emitting diodes.

Various embodiments with various variations have been described hereabove. It should be noted that those skilled in the art may combine these various embodiments and variations without showing any inventive step. In particular, the embodiment shown in FIG. 6 where photodiode PH is not covered with encapsulation layer 29 may be combined with the embodiment shown in FIG. 1 where electrode 12 is located on the surface 16 of substrate 14 opposite to surface 18 supporting wires 20. Similarly, the embodiment shown in FIG. 8 where photodiode PH is covered with a colored filter 72 may be combined with the embodiment shown in FIG. 1 where electrode 12 is located on the surface 16 of substrate 14 opposite to surface 18 supporting wires 20.

The invention claimed is:

1. A light-emitting device comprising:
    an at least partially doped substrate of a first conductivity type, comprising a first surface;
    light-emitting diodes each comprising at least one non-doped or doped three-dimensional semiconductor element of the first conductivity type, the semiconductor elements resting on a first continuous portion of the first surface, wherein the semiconductor elements are nanowires, microwires, and/or nanometer or micrometer-range pyramidal structures; and
    at least one at least partially doped semiconductor region forming a photodiode, of a second conductivity type opposite to the first conductivity type and extending in the substrate from a second portion of the first surface different from the first portion,
    wherein the semiconductor region is covered with a colored filter,
    wherein the light-emitting diodes are distributed in assemblies of light-emitting diodes, the light-emitting device comprising, for at least some of the assemblies, at least two semiconductor regions forming first and second photodiodes, each of the two semiconductor regions being at least partially doped with a second conductivity type opposite to the first conductivity type and extending in the substrate from the second portion of the first surface, the first and second photodiodes being covered with filters of different colors.

2. The light-emitting device of claim 1, wherein each three-dimensional semiconductor element is mainly made of a compound selected from the group comprising III-V compounds and II-VI compounds.

3. The light-emitting device of claim 1, wherein the substrate is at least partly made of a semiconductor material selected form the group comprising silicon, germanium, silicon carbide, III-V compounds, or ZnO.

4. The light-emitting device of claim 1, wherein the substrate comprises a second surface opposite to the first surface, the light-emitting device comprising a first electrode in contact with the second surface or with the first surface (18).

5. The light-emitting device of claim 4, comprising a second electrode in contact at least with some of the light-emitting diodes and a third electrode in contact with the semiconductor region on the side of the first surface.

6. The light-emitting device of claim 1, wherein light-emitting diodes are covered with a layer comprising phosphors and wherein the semiconductor region is not covered with said layer comprising phosphors.

7. The light-emitting device of claim 1, wherein the semiconductor region is formed by ion implantation of dopants.

8. The light-emitting device of claim 1, wherein the semiconductor region is formed by epitaxy.

9. The light-emitting device of claim 1, wherein the light-emitting diodes are distributed in assemblies of light-emitting diodes, said semiconductor region being located between the two assemblies.

10. The light-emitting device of claim 9, wherein a control circuit is capable, in a calibration phase, of successively turning on each assembly of light-emitting diodes, and a processing circuit is capable of measuring the radiation captured by the photodiode when each assembly of light-emitting diodes is on.

11. The light-emitting device of claim 1, comprising a circuit for processing first signals supplied by the photodiode and a circuit for controlling the light-emitting diodes from second signals supplied by the processing circuit.

12. The light-emitting device of claim 11, wherein the control circuit is capable, in a calibration phase, of successively turning on each assembly of light-emitting diodes, the processing circuit being capable of measuring the radiation captured by the photodiode when each assembly of light-emitting diodes is on.

* * * * *